US010770455B2

(12) United States Patent
Roig-Guitart

(10) Patent No.: US 10,770,455 B2
(45) Date of Patent: Sep. 8, 2020

(54) ELECTRONIC DEVICE INCLUDING A TRANSISTOR AND A VARIABLE CAPACITOR

(71) Applicant: SEMICONDUCTOR COMPONENTS INDUSTRIES, LLC, Phoenix, AZ (US)

(72) Inventor: Jaume Roig-Guitart, Oudenaarde (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/141,557

(22) Filed: Sep. 25, 2018

(65) Prior Publication Data

US 2020/0098745 A1    Mar. 26, 2020

(51) Int. Cl.
*H01L 27/06* (2006.01)
*H01L 29/778* (2006.01)
*H03K 17/687* (2006.01)
*H01L 27/088* (2006.01)
*H01L 29/861* (2006.01)
*H01L 29/93* (2006.01)

(52) U.S. Cl.
CPC ...... *H01L 27/0629* (2013.01); *H01L 27/0883* (2013.01); *H01L 29/778* (2013.01); *H01L 29/861* (2013.01); *H01L 29/93* (2013.01); *H03K 17/687* (2013.01)

(58) Field of Classification Search
CPC .................................................. H01L 27/0248
See application file for complete search history.

(56) References Cited

U.S. PATENT DOCUMENTS

| 9,947,654 | B2 | 4/2018 | Jeon et al. | |
| 2005/0225373 | A1* | 10/2005 | Morita | H03K 17/567 327/374 |
| 2011/0291738 | A1 | 12/2011 | Biela et al. | |
| 2014/0062585 | A1* | 3/2014 | Weis | H03K 17/102 327/541 |

(Continued)

FOREIGN PATENT DOCUMENTS

DE     102007058388 A1     9/2008

OTHER PUBLICATIONS

U.S. Appl. No. 15/977,051, filed May 11, 2018; Roig-Guitart et al., Specification pp. 1-20, Drawing sheets 1-8.

(Continued)

*Primary Examiner* — Lex H Malsawma
*Assistant Examiner* — Geoffrey H Ida
(74) *Attorney, Agent, or Firm* — Abel Schillinger, LLP

(57) ABSTRACT

In an aspect, a circuit can include a first HEMT, a second HEMT, and a variable capacitor. A drain of the first HEMT can be coupled to a source of the second HEMT. An electrode of the variable capacitor can be coupled to a source of the first HEMT, and another electrode of the variable capacitor can be coupled to a gate of the second HEMT. In another aspect, an electronic device can include a die including a HEMT and a variable capacitor. An electrode of the variable capacitor can be coupled to a source or a gate of the HEMT, and another electrode of the variable capacitor can be coupled to an external terminal of the die. In a further aspect, an electronic device comprising a die, wherein the die includes a variable capacitor, a first diode, and a second diode.

19 Claims, 6 Drawing Sheets

(56) References Cited

U.S. PATENT DOCUMENTS

2016/0036393 A1    2/2016  Lin et al.

OTHER PUBLICATIONS

VisIC Technologies, "Industry's first 1200V Half Bridge Module Based on GaN Technology", IEEE Applied Power Electronics Conference; 2018; pp. 1-26.

VisIC Techonologies; 1200V GaN Half Bridge VM4OHB120D Data Sheet; 2018; pp. 1-9.

Roig et al., "Series-Connected GaN Transistors for Ultra-Fast High-Voltage Switch (> 1kV)", IEEE Applied Power Electronics Conference; 2017; pp. 1-6. (Paper).

Roig et al., "Series-Connected GaN Transistors for Ultra-Fast High-Voltage Switch (> 1kV)", IEEE Applied Power Electronics Conference; 2017; pp. 1-25. (Presentation).

Bendel et al., "Using 'Normally on' JFETs in Power Systems", Bodo's Power Systems; 2015, pp. 40-43.

Daniel Aggeler; "Bidirectional Galvanically Isolated 25 kW 50 kHz 5 kV/700V Si-SiC SuperCascode/Si-IGBT DC-DC Converter" (PhD Thesis); ETH Zurich; 2010; pp. 1 to 179, especially Sections 2.1.1 and 3.1.3.

Elpelt et al., "Serial Connection of SiC JFETs—Features of a Fast High Voltage Switch", Les Composants de Puissance; 2004; pp. 60-71.

English translation of Search Report of DE 10 2019 120 731.2 (corresponds to U.S. Appl. No. 16/141,557); German Patent Office; pp. 1 to 7 (dated Feb. 13, 2020).

\* cited by examiner

ELECTRONIC DEVICE INCLUDING A TRANSISTOR AND A VARIABLE CAPACITOR

FIELD OF THE DISCLOSURE

The present disclosure relates to electronic devices, and more particularly to, electronic devices that include transistors and variable capacitors.

RELATED ART

High electron mobility transistors can be made to operate at a variety of high voltages. However, above a particular voltage, such as 650 V, the design of the transistor may become more complicated or experience adverse effects in GaN-on-Silicon substrates. For example, at a voltage higher than 650 V, a buffer layer may need to be significantly thicker and result in high mechanical stress that may cause a wafer to warp. Forming a GaN layer over sapphire, SiC, growing a GaN bulk substrate, or transferring a GaN layer by substrate removal may be difficult for commercial production levels. Further improvements to high voltage circuits using high electron mobility transistors is desired.

BRIEF DESCRIPTION OF THE DRAWINGS

Embodiments are illustrated by way of example and are not limited in the accompanying figures.

Figure 1:
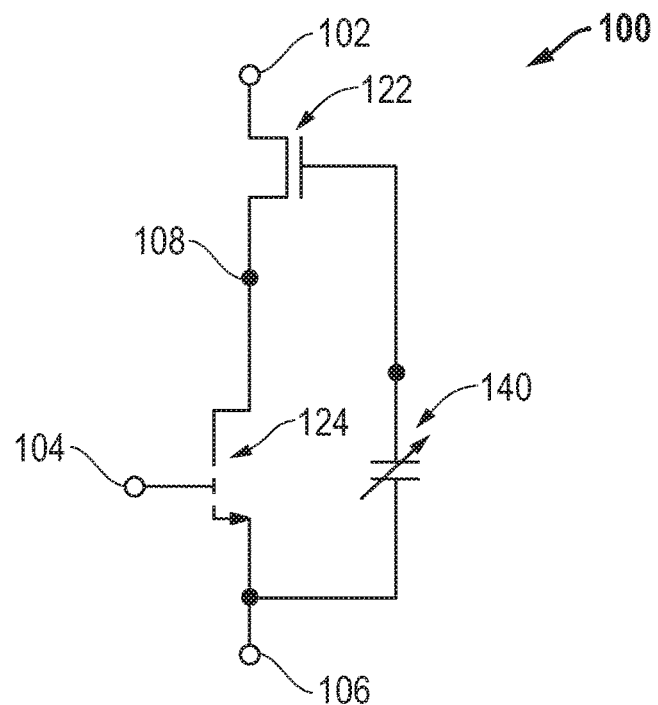
FIG. 1 includes a depiction of a schematic diagram of a circuit in accordance with an embodiment.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

Group numbers correspond to columns within the Periodic Table of Elements based on the IUPAC Periodic Table of Elements, version dated Nov. 28, 2016.

The term "compound semiconductor" is intended to mean a semiconductor material that includes at least two different elements. Examples include SiC, SiGe, GaN, InP, $Al_wGa_{(1-w)}N$ where $0 \leq w \leq 1$, CdTe, and the like. A III-V semiconductor material is intended to mean a semiconductor material that includes at least one trivalent metal element and at least one Group 15 element. A III-N semiconductor material is intended to mean a semiconductor material that includes at least one trivalent metal element and nitrogen. A Group 13-Group 15 semiconductor material is intended to mean a semiconductor material that includes at least one Group 13 element and at least one Group 15 element.

The term "high voltage," with reference to a layer, a structure, or a device, means that such layer, structure, or device can withstand at least 200 V difference across such layer, structure, or device (e.g., between a source and a drain of a transistor when in an off-state) without exhibiting dielectric breakdown, avalanche breakdown, or the like.

The terms "normal operation" and "normal operating state" refer to conditions under which an electronic component or device is designed to operate. The conditions may be obtained from a data sheet or other information regarding voltages, currents, capacitances, resistances, or other electrical parameters. Thus, normal operation does not include operating an electrical component or device well beyond its design limits.

For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles.

The terms "on," "overlying," and "over" may be used to indicate that two or more elements are in direct physical contact with each other. However, "over" may also mean that two or more elements are not in direct contact with each other. For example, "over" may mean that one element is above another element but the elements do not contact each other and may have another element or elements in between the two elements.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

A circuit can be designed to operate at a higher voltage than a maximum safe operating voltage of any transistor within the circuit. The circuit is well suited for high electron mobility transistors (HEMTs) and can be implemented without complications that can occur with scaling a single HEMT to operate at a higher voltage. In an embodiment, a modular design can be used to allow for easier scaling to higher operating voltages for the circuit. By limiting the normal operating voltage of each HEMTs within the circuit, a single HEMT with a very high breakdown voltage circuit is not needed and can obviate having to devise a new, complicated or marginal process technology or physical design of the single HEMT.

In an embodiment, a high-side transistor can be a depletion mode transistor, and a low-side transistor can be an enhancement-mode transistor, where a control signal to a gate of the low-side transistor can be used to turn the circuit on and off. A variable capacitor can be used to provide a desired voltage at the node between the source of the high-side transistor and the drain of the low-side transistor. If needed or desired, diodes can be used to control a voltage on a gate of the high-side transistor. The variable capacitor and diodes can be designed to use an AlGaN technology that may also be used for the high-side and low-side transistors. The variable capacitor and diodes can be implemented by modifying existing masks to incorporate the variable capacitor and diodes, within having to add or develop a new step or use a complex or complicated processing sequence. In a particular embodiment, any individual or combination of the variable capacitor and diodes may occupy no more than 20% of the area of the die on which it resides. In another embodiment, the variable capacitor and diodes can be on a separate die to allow for a modular construction that is well suited to be used over a wider range of voltages for the circuit.

In an aspect, a circuit can include a first HEMT, a second HEMT, and a variable capacitor. A drain of the first HEMT can be coupled to a source of the second HEMT. A first electrode of the variable capacitor can be coupled to a source of the first HEMT, and a second electrode of the variable capacitor can be coupled to a gate of the second HEMT.

In another aspect, an electronic device can include a die including a first HEMT and a variable capacitor. A first electrode of the variable capacitor can be coupled to a source or a gate of the first HEMT, and a second electrode of the variable capacitor can be coupled to a first external terminal of the first die.

In a further aspect, an electronic device comprises a die, wherein the die includes a variable capacitor, a first diode, and a second diode. A first electrode of the variable capacitor can be coupled to a first external terminal of the first die. A second electrode of the variable capacitor and a cathode of the first diode can be coupled to a second external terminal of the first die. An anode of the first diode can be coupled to an anode of the second diode. A cathode of the second diode can be coupled to a third external terminal of the first die.

In this specification, associations between components are described with respect to couplings. In particular embodiment, any or all of the couplings can be in the form of electrical connections, that is, connections without any intervening components, such as resistors, capacitors, transistors, or the like. Accordingly, the electrical connections can be represented as a node. For example, a source of a high-side transistor and a drain of a low-side transistor can be electrically connected to a node such that the source and drain are at substantially the same voltage.

FIG. 1 includes a depiction of a schematic of a circuit 100 that includes a high-side HEMT 122, a low-side HEMT 124, and a variable capacitor 140. The arrangement of the high-side and low-side HEMTs 122 and 124 can allow the voltage difference between the drain and source terminals 102 and 106 to be higher than the voltage that each of the HEMTs 122 and 124 can withstand during normal operation of the circuit 100. In an embodiment, the high-side HEMT 122 is a depletion-mode transistor, and the low-side HEMT 124 is an enhancement-mode transistor. The circuit 100 can be turned on with a sufficiently positive gate-to-source voltage ($V_{GS}$) on the low-side HEMT 124.

The drain terminal 102 for the circuit 100 is coupled to a drain of the high-side HEMT 122, a control terminal 104 is coupled to a gate of the low-side HEMT 124, and the source terminal is coupled to a source of the low-side HEMT 124. Each of the drain, control, and source terminals are examples of external terminals that allow the circuit 100 to be connected to other components or circuits. For example, a high-voltage power supply can be coupled to the drain terminal 102, a low-voltage power supply (e.g., 0 V or ground) can be coupled to the source terminal 106, and a gate controller, a gate driver, or both may be coupled to the control terminal 104. A source of the high-side HEMT 122 and a drain of the low-side HEMT 124 are coupled to each other at a node 108. An electrode of the variable capacitor 140 is coupled to a gate of the high-side HEMT 122, and another electrode of the variable capacitor 140 is coupled to the source of the low-side HEMT 124.

The variable capacitor 124 helps to keep the node 108 at a desired voltage when the circuit 100 is off (e.g., $V_{GS}$ for the low-side HEMT 124 is less than the threshold voltage for the low-side HEMT 124). In an embodiment, with substantially identical voltage capability for low-side and high-side HEMTs, when the circuit 100 is in the off-state, the voltage on the node 108 is half of the voltage difference between the drain terminal 102 (or the drain of the high-side HEMT 122) and the source terminal 106 (or the source of the low-side HEMT 124), or $V_{NODE\_108} = V_{DS\_CIRCUIT}/2$. In order to account for some manufacturing differences between the HEMTs 122 and 124 and variable capacitor 140, the voltage at the node 108 may between within 10% of $V_{DS\_CIRCUIT}/2$.

Figure 2:
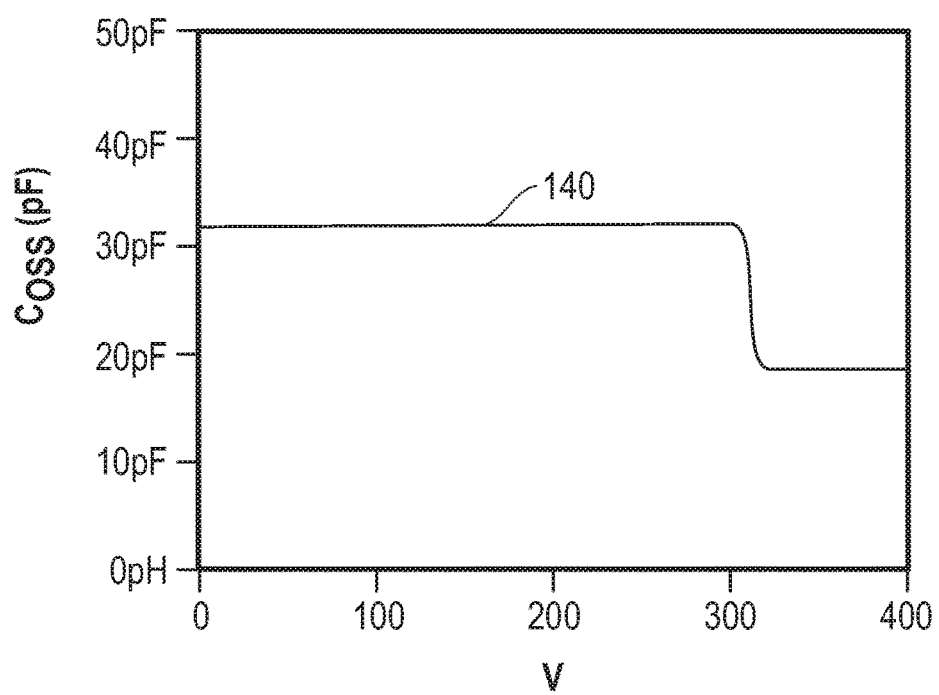
FIG. 2 includes a plot of capacitance as a function of voltage across electrodes of a variable capacitor.

The variable capacitor 140 can have a capacitance ($C_{AK}$) that changes with voltage across its electrodes. FIG. 2 includes a plot of $C_{AK}$ as a function of a voltage difference between its electrodes. As seen in FIG. 2, $C_{AK}$ significantly decreases at a voltage in a range from 300 V to 320 V, and is relatively constant at voltages higher than 320 V. As will be addressed later in this specification, the variable capacitor 140 can be in the form of a field electrode capacitively coupled to a channel or barrier layer that is common with the low-side HEMT 124. The voltage at which $C_{AK}$ changes may be affected by the physical design (e.g., the thickness of the capacitor dielectric), composition of one or both capacitor electrodes (e.g., Al content of a barrier layer, work function of an overlying capacitor electrode, etc.), or the like. Simulations may be run to determine where the change in $C_{AK}$ occurs for a particular capacitor structure used. The output capacitance of the HEMTs 122 and 124 is substantially constant when $V_{DS}$ is greater than 250 V.

Figure 3:
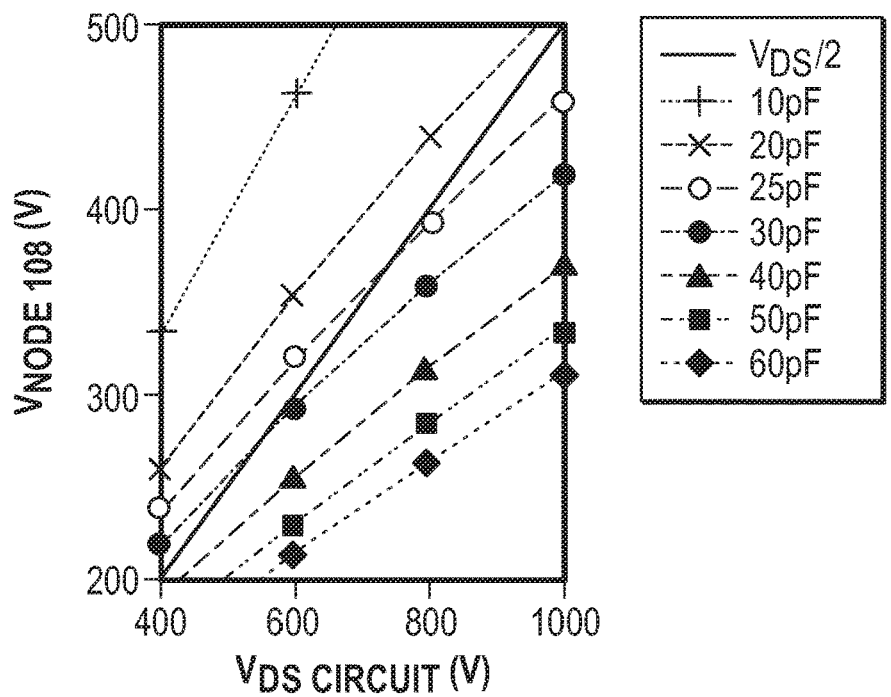
FIG. 3 includes plots of voltage at an intermediate node as a function of circuit voltage for different capacitances.

A prototype electronic device can be used to determine a capacitance that can be used for different voltages between the drain and source terminals 102 and 106. The prototype device includes the circuit 100 and further includes a diode, wherein an anode of the diode is coupled to one of the electrodes of the variable capacitor 140, and a cathode of the diode is coupled to the other electrode of the variable capacitor 140. FIG. 3 includes plots of $V_{NODE\ 108}$ as a function $V_{DS\ CIRCUIT}$ for different capacitances of the variable capacitor 140. When the circuit 100 is design for an even distribution of voltages between high-side and low-side HEMTs 122 and 124 and $V_{DS\ CIRCUIT}$ of 800 V, a desired capacitance can be approximately 25 pF; for $V_{DS\ CIRCUIT}$ Of 1000 V, the capacitance can be approximately 22 pF; and for $V_{DS\ CIRCUIT}$ of 400 V, the capacitance can be approximately 33 pF. When $V_{DS\ CIRCUIT}$ is designed for at least 100 V, in an embodiment, $C_{AK}$ can be at least 2 pF, at least 5 pF, or at least 11 pF, and in another embodiment, $C_{AK}$ can be at most 200 pF, at most 90 pF, or at most 60 pF. For $V_{DS\ CIRCUIT}$ in a range from 400 V to 1000 V, $C_{AK}$ can be in a range from 20 pF to 40 pF.

Figure 4:
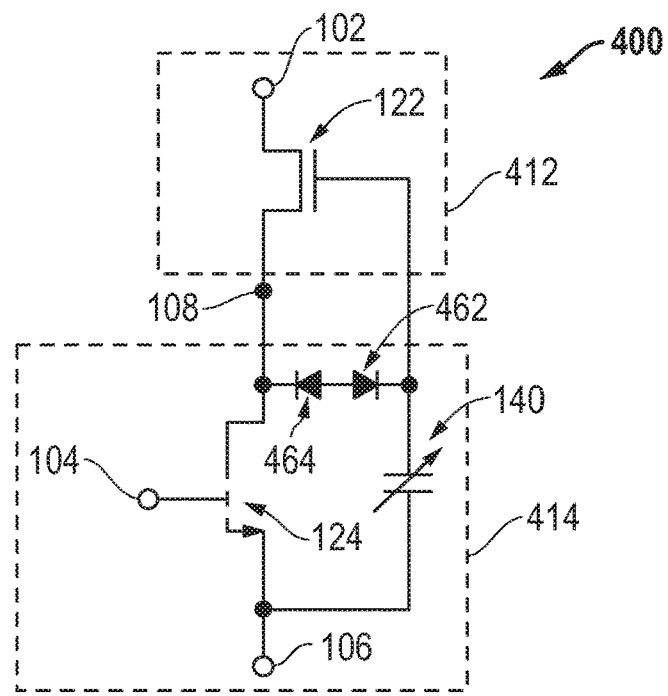
FIG. 4 includes a depiction of a schematic diagram of a circuit in accordance with another embodiment.

FIG. 4 includes an embodiment of a circuit 400 that is similar to the circuit 100 and further includes a set of back-to-back diodes, and a physical implementation of the circuit 400. The circuit 400 includes a set of back-to-back diodes 462 and 464. The diodes 462 and 464 help to regulate the voltage on the gate of the high-side HEMT 122, so that the voltage difference between gate and source of the high-side HEMT 122 does not become too large. The breakdown voltage of each of the diodes 462 and 464 can be at most 50 V, at most 30 V, or at most 20 V. The diodes 462 and 464 can have different breakdown voltages. In a particular embodiment, $V_{GS}$ for the high-side HEMT 122 can be a range from −20 V to +5 V before the high-side HEMT 122 is adversely affected. Thus, the breakdown voltage of the diode 462 may be at most 5 V, and the breakdown voltage of the diode 464 may be at most 20 V. Other breakdown voltages for the diodes 462 and 464 may be used. Exemplary physical designs for the diodes 462 and 464 are addressed later in this specification.

Figure 5:
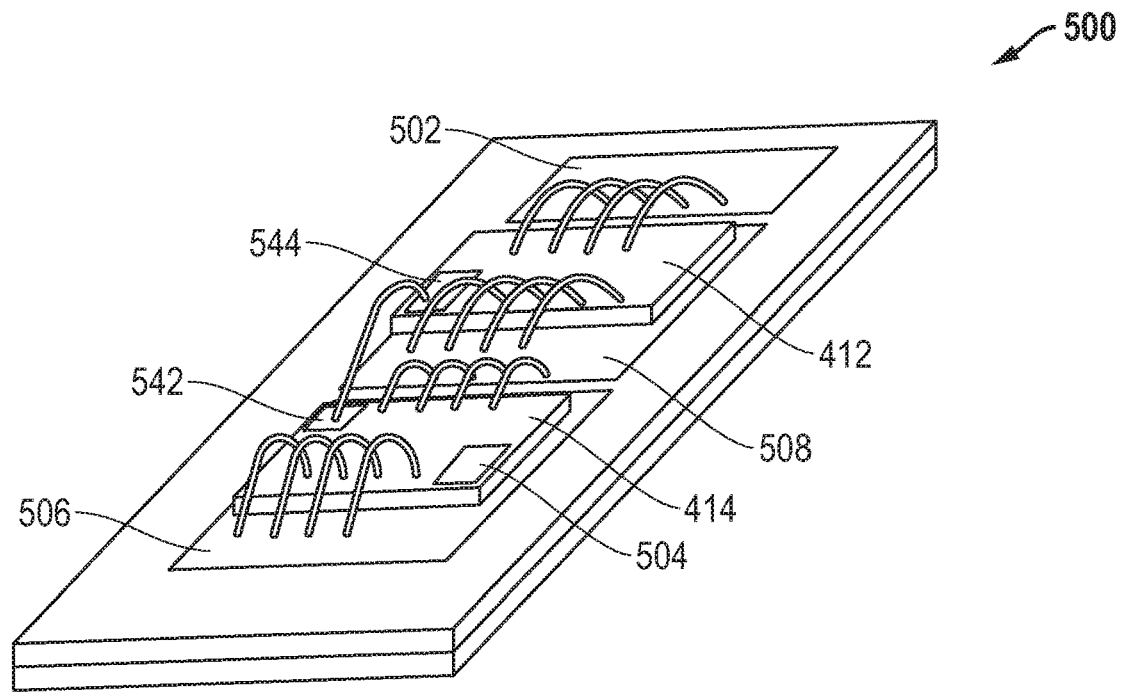
FIG. 5 includes an illustration of a perspective view of a layout for an electronic device that includes the circuit in FIG. 4 in accordance with an embodiment.

The components of the circuit 400 can be on a plurality of dies. In an embodiment, one semiconductor die 412 can include the high-side HEMT 122, and another semiconductor die 414 can include the low-side HEMT 124, the variable capacitor 140, and the diodes 462 and 464. FIG. 5 includes a perspective view of a non-limiting, exemplary embodiment of an electronic device 500 that includes the circuit 200. Electrical connections between the semiconductor die 412 and 414 and other portions of the electronic device 500 can be in the form of bond wires or clips. Substrates of the semiconductor dies 412 and 414 and are attached and electrically connected to conductive members 506 and 508.

A conductive member 502 can be the drain terminal 102, the conductive member 508 can be part of the intermediate node 108, and the conductive member 506 can be the source terminal 106. One or more clips or bond wires can connect the conductive member 502 to a drain bond pad or plate of the high-side HEMT 122, and another one or more clips or bond wires can connect the conductive member 508 to a source bond pad or plate of the high-side HEMT 122. One or more clips or bond wires can connect the conductive member 508 to a drain bond pad or plate of the low-side HEMT 124, another one or more clips or bond wires can connect the conductive member 506 to a source bond pad or plate of the low-side HEMT 124. A gate bond pad 504 for the low-side HEMT 124 can be the control terminal 104 for the circuit 400. A bond wire or clip electrically connects a gate bond pad 544 for the high-side HEMT 122 to a conductive bond pad 542 on the low-side HEMT 124.

Figure 6:
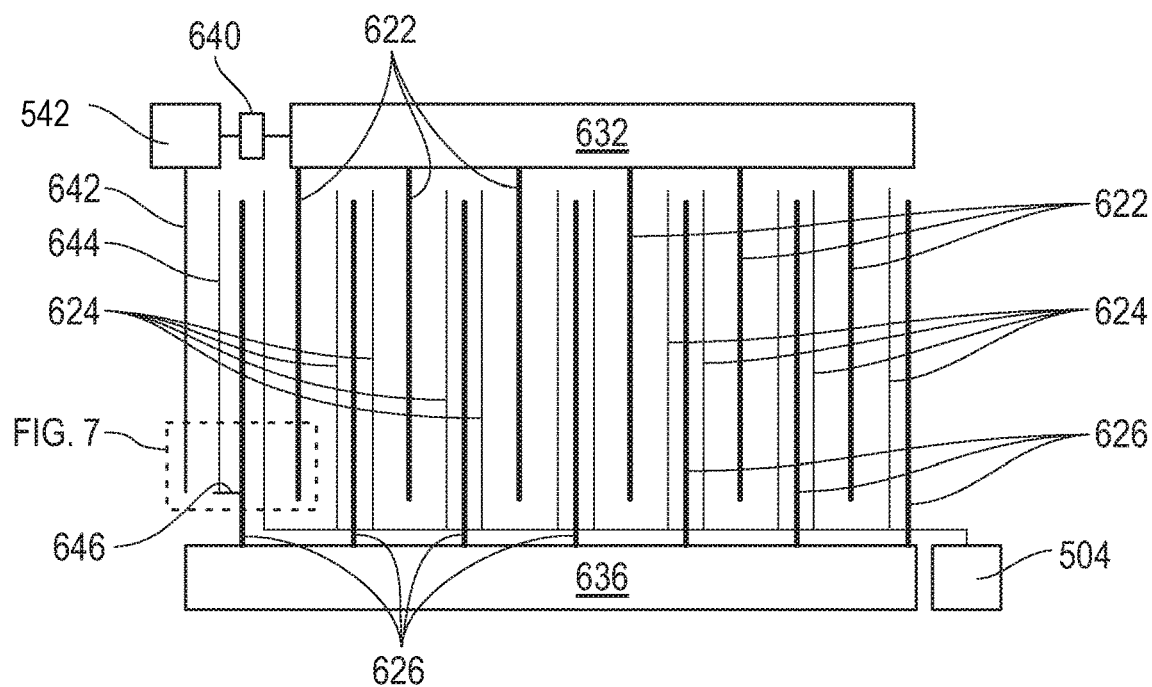
FIG. 6 includes an illustration of a top view of a layout for a die that includes a low-side transistor, a variable capacitor, and diodes in FIG. 4 in accordance with an embodiment.

FIG. 6 includes a top view of a non-limiting, exemplary layout of the semiconductor die 414. A majority of the area of the semiconductor die 414 is occupied by the low-side HEMT 124 that includes drain electrodes 622 coupled to a drain bond pad 632, gate electrodes 624 coupled to the gate bond pad 504, and source electrodes 626 coupled to a source bond pad 636. In another embodiment, a drain plate, a source plate, or both can be used instead of the drain and source bond pads 632 and 636. Details regarding drain and source plates can be found in U.S. application Ser. No. 15/977,051 filed May 11, 2018, which is incorporated herein by reference for its teachings regarding bond pads and plates and their connections internal and external for a workpiece, such as a semiconductor die. As used herein, external terminals are relative to a circuit or a component within the circuit. For example, terminals 102, 104, and 106 are external terminals of the circuit 400, and the pads 632, 504, 542, and 636 are external terminals for the die 414.

The variable capacitor 140 is located near the left-hand side of FIG. 6. The left-most source electrode 626 is coupled to a capacitor electrode 644 of the variable capacitor 140 by an interconnect 646. An interconnect 642 is coupled to an underlying barrier or channel layer that is the other electrode for the variable capacitor 140. The capacitor electrode 644 may be formed using the same processing sequence to form the gate electrodes 624, and the interconnect 642 may be formed using the same processing sequence to form the drain electrodes 622. The interconnect 646 may be formed during the same processing sequence to form the gate electrodes 624, the source electrodes 626, or during a processing sequence different from each of the gate and source electrodes 624 and 626. The area occupied by the variable capacitor 140 can be in a range from 0.2% to 20% of the area of the semiconductor die 414.

In FIG. 6, the diodes 462 and 464 are within a box 640 that is located between the drain bond pad 632 of the low-side HEMT 124 and the bond pad 542. The area occupied by the diodes 462 and 464 is significantly less than the area occupied by the variable capacitor 140. The diodes 462 and 464 may occupy at most 5% or at most 1% of the area of the semiconductor die 414.

Figure 7:
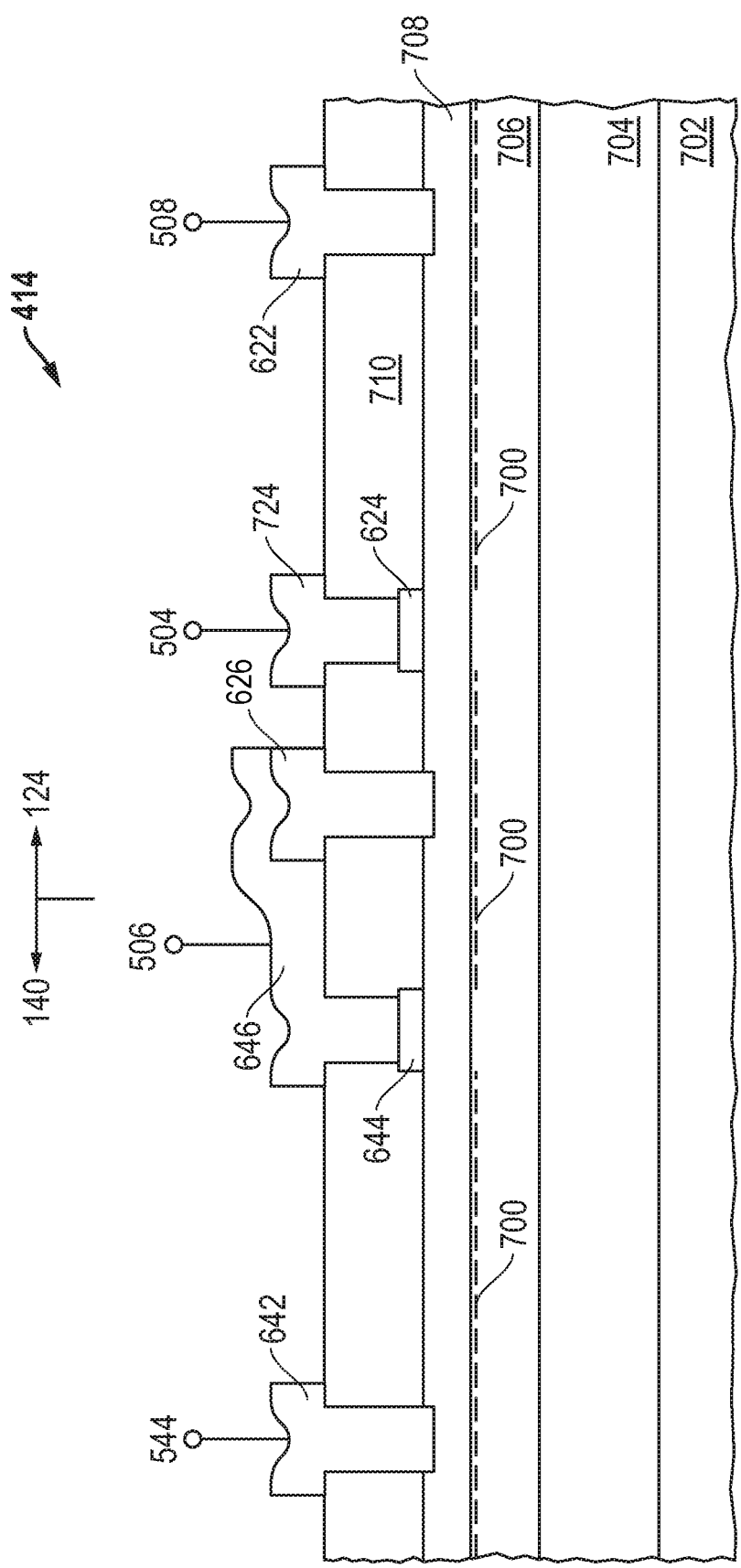
FIG. 7 includes an illustration of a cross-section view of portions of the low-side transistor and variable capacitor in FIG. 6.

FIG. 7 includes a cross-sectional view of a portion of the semiconductor die 414 at the region indicated in FIG. 6. The right-hand side of FIG. 7 includes the low-side HEMT 124, and the left-hand side includes a portion of the variable capacitor 140.

The semiconductor die 414 includes a semiconductor substrate 702, a buffer layer 704, a channel layer 706, and a barrier layer 708. The substrate 702 can include silicon, sapphire (monocrystalline $Al_2O_3$), silicon carbide (SiC), aluminum nitride (AlN), gallium oxide ($Ga_2O_3$), spinel ($MgAl_2O_4$), another suitable substantially monocrystalline material, or the like. The selection of the particular material and crystal orientation along the primary surface can be selected depending upon the composition of the overlying semiconductor layers.

The buffer layer 704 can include a III-N material, and in a particular embodiment, include $Al_aGa_{(1-a)}N$, where $0 \leq a \leq 1$. The composition of the buffer layer 704 may depend on the composition of the semiconductor base material of the channel layer 706 and the designed operating voltage of the HEMT. The composition of the buffer layer 704 can be changed as a function of thickness, such that the buffer layer 704 has a relatively greater aluminum content closer to the substrate 702 and relatively greater gallium content closer to the channel layer 706. In a particular embodiment, the cation (metal atoms) content in the semiconductor base material the buffer layer 704 near the substrate 702 can be 10 atomic % to 100 atomic % Al with the remainder Ga, and the cation content in the semiconductor base material the buffer layer 704 near the channel layer 706 can be 0 atomic % to 50 atomic % Al with the remainder Ga. In another embodiment, the buffer layer 704 can include a plurality of films. The buffer layer 704 can have a thickness in a range from approximately 1 micron to 6 microns.

The channel layer 706 can include $Al_zGa_{(1-z)}N$, where $0 \leq z \leq 0.1$ and have a thickness in a range from approximately 10 nm to 4000 nm. In a particular embodiment, the channel layer 706 is a GaN layer (z=0). The channel layer 706 may be unintentionally doped or doped with an electron donor (n-type) dopant or an electron acceptor (p-type) dopant. A high density two dimensional electron gas (2DEG) can be formed near portions of the interface of the channel layer 706 and the barrier layer 708 and is responsible for high mobility and lower resistivity of the transistor structure when in the on-state. In an enhancement-mode HEMT, a 2DEG may not be present under the gate structure when the HEMT is in an off-state. Any reduction of the 2DEG electrons will increase the on-resistance of the transistor. In an embodiment, the concentration of acceptors (when the carriers are electrons) or donors (when the carriers are holes) may be kept as low as reasonably possible.

In a particular embodiment, acceptors can include carbon from a source gas (e.g., $Ga(CH_3)_3$) when metalorganic chemical vapor deposition (MOCVD) is used to form the channel layer 706. In a particular embodiment, the lowest trap concentration is desired but may be limited by growth or deposition conditions and purity of the precursors. Thus, some carbon can become incorporated as the channel layer 706 is grown, and, such carbon can result in unintentional doping. The carbon content may be controlled by controlling the deposition conditions, such as the deposition temperature and flow rates. In an embodiment, the channel layer 706 has a carrier impurity concentration that is greater than 0 and at most $5 \times 10^{17}$ atoms/$cm^3$. In a further embodiment, the carrier impurity concentration is in a range from $1 \times 10^{15}$ atoms/$cm^3$ to $5 \times 10^{16}$.

In an embodiment, the channel layer 706 has a thickness that is at least 50 nm. When the thickness is less than 50 nm, a 2DEG may be more difficult to generate, maintain, or both. In another embodiment, the channel layer 706 has a thickness that is at most 5000 nm. In a particular embodiment, the thickness in a range from 50 nm to 300 nm can provide, _sufficiently thick channel layer 706 to allow for the proper generation and maintaining of the 2DEG and still obtain a reasonable value for $R_{DsoN}$. Although not illustrated, a spacer layer may be used between the channel and barrier layers 706 and 708 if desired.

The barrier layer 708 can include a III-V semiconductor base material, such as a III-N semiconductor base material. In a particular embodiment, the barrier layer can include $Al_xIn_yGa_{(1-x-y)}N$, wherein $0 \leq x \leq 1$ and $0 \leq y \leq 0.3$. The barrier layer 708 can include a single film or a plurality of films. When the barrier layer 708 includes a plurality of films, the aluminum content can remain substantially the same or increase as distance from the channel layer 706 increases. As the aluminum content in the barrier layer 708 increases, the thickness of the barrier layer 708 may be relatively thinner. In an embodiment, the barrier layer 708 has a thickness of at least 5 nm, and in another embodiment, the barrier layer 708 has a thickness of at most 150 nm. In a particular embodiment, the barrier layer 708 has a thickness in a range from 20 nm to 90 nm.

The buffer layer 704, the channel layer 706, and barrier layer 708 can be formed using an epitaxial growth technique, and thus, the barrier layer 708, the channel layer 706, and at least a portion of the buffer layer 704 can be monocrystalline. In a particular embodiment, metal-containing films can be formed using metalorganic chemical vapor deposition.

The gate electrode 624 of the low-side HEMT 124 and the capacitor electrode 644 of the variable capacitor 140 overlie the barrier layer 708. Each of the gate and capacitor electrodes 624 can include a p-type semiconductor material. In an embodiment, the p-type semiconductor material can include p-type doped $Al_cGa_{(1-c)}N$ wherein $0 \leq c \leq 1$. The p-type dopant can include Mg, Zn, Cd, or the like. The p-type semiconductor material can be monocrystalline or polycrystalline. The gate and capacitor electrodes 624 and 644 layer can have a dopant concentration of at least $1 \times 10^{18}$ atoms/$cm^3$. In another embodiment, the dopant concentration is at most $1 \times 10^{21}$ atoms/$cm^3$. The gate and capacitor electrodes 624 and 644 can be formed from an electrode layer can be formed using any of the techniques that can be used in forming the channel layer 706 or the barrier layer 708. The p-type dopant can be incorporated in-situ or introduced into the gate electrode layer after deposition.

The electrode layer can be patterned to achieve the shape of the gate and capacitor electrodes 624 and 644. Portions of the electrode layer lying outside the gate and capacitor electrodes 624 and 644 can be removed using a technique that does not significantly etch the barrier layer 708. When the electrode layer includes p-type GaN, the electrode layer can be dry etched using a fluorine chemistry, such as $SF_6$, $CHF_3$, $NF_3$, or the like. Aluminum-containing films or layers are not significantly etched using a fluorine chemistry, as $AlF_3$ forms and stops further etching of the aluminum-containing films or layers. Thus, the barrier layer 708 is not significantly etched when forming the gate and capacitor electrodes 624 and 644. A 2DEG 700 is formed along the interface between the channel and barrier layers 706 and 708 except for under the electrodes 624 and 644.

In another embodiment (not illustrated), access regions may be formed. Sacrificial structures can be formed within the regions where the gate and capacitor electrodes 624 and 644 will be formed, and the access regions can be grown over exposed portions of the barrier layer 708. After removing the sacrificial structures, the gate and capacitor electrodes 624 and 644 can be formed at locations where the sacrificial structures were. Thus, different process flows may be used without deviating from the concepts as described herein.

An interlevel dielectric (ILD) layer 710 can be formed over the barrier layer 708 and the electrodes 624 and 644. The ILD layer 710 can include a single film or a plurality of films. The single film or each of the films can include an oxide, a nitride, or an oxynitride. The ILD layer 710 can have a thickness in a range from 20 nm to 500 nm.

Contact openings for the drain and source electrodes 622 and 626 and the interconnect 642 can extend through the ILD layer 710. In an embodiment, the contact openings land on the barrier layer 708, and in another embodiment, the contact openings can extend through and part of, but not all, of the thickness of the barrier layer 708 or extend through all of the thickness of the barrier layer 708 and contact the channel layer 706.

A conductive layer is formed over the ILD layer 710 and within the contact openings. The conductive layer can include a single film or a plurality of films. In an embodiment, the conductive layer can include an adhesion film and a barrier film. Such films may include Ta, TaSi, Ti, TiW, TiSi, TiN, or the like. The conductive layer can further include a conductive bulk film. The bulk film can include Al, Cu, or another material that is more conductive than other films within the conductive layer. In an embodiment, the bulk film can include at least 90 wt. % Al or Cu. The bulk film can have a thickness that is at least as thick as the other films within the conductive layer. In an embodiment, the bulk film has a thickness in a range from 20 nm to 900 nm and, in a more particular embodiment, in a range from 50 nm to 500 nm. More or fewer films can be used in the conductive layer. The number and composition of the films within the conductive layer can depend on the needs or desires for a particular application. After reading this specification, skilled artisans will be able to determine the composition of the conductive layer that is tailored to their devices. The conductive layer is patterned to form the drain and source electrodes 622 and 626 and the interconnect 642.

Contact openings for the gate interconnect 724 and the interconnect 646 can extend through the ILD layer 710 and land on the gate electrode 624 and the capacitor electrode 644. A conductive layer is formed over the ILD layer 710 and within the contact openings to the gate and capacitor electrodes 624 and 644. The conductive layer can include any of the compositions and thicknesses are previously described with respect to the conductive layer for the drain and source electrodes 622 and 626 and the interconnect 642. The conductive layer for the interconnects 646 and 724 can have the same or different compositions as compared to the conductive layer for the drain and source electrodes 622 and 626 and the interconnect 642. The conductive layer for the interconnects 646 and 724 can have the same or different thicknesses as compared to the conductive layer for the drain and source electrodes 622 and 626 and the interconnect 642. The interconnect 646 extends over the source electrode 626 to provide an electrical connection between the source electrode 626 and the capacitor electrode 644.

FIGS. 5 to 7 illustrate portions of the semiconductor die 414 that are electrically connected to external terminals outside the semiconductor die 414. The drain electrodes 622 are connected to the conductive member 508 via the drain bond pad 632. The gate electrodes 624 are connected to the control terminal 104 that is in the form of the gate pad 504. The capacitor electrode 644 is electrically connected to the source electrodes 626 via the interconnect 646, and the source electrodes 626 are electrically connected to the conductive member 506 via the source bond pad 636. The interconnect 642 is electrically connected to the bond pad 542 that is electrically connected to the bond pad 544.

In another embodiment (not illustrated), the variable capacitor 140 can include a dielectric layer and a metal-based capacitor electrode. A capacitor dielectric can be formed over the barrier layer 708 or may be the lowest film (closest to the barrier layer 708) within the ILD layer 710. An opening for the interconnect 646 may stop on or within the lowest film within the ILD layer 710. The interconnect 646 can have a composition as previously described conductive layer as previously described with respect to the gate interconnect 724. In another embodiment, the interconnect 646 can include a conductive film in contact with the capacitor dielectric that achieves a desired work function for the structure. In this embodiment, the transistor structures in the low-side HEMT 124 may also have the gate electrodes 624 replaced by the dielectric layer, and the gate interconnect 724 may also be a gate electrode and have its composition selected to achieve a desired work function.

Figure 8:
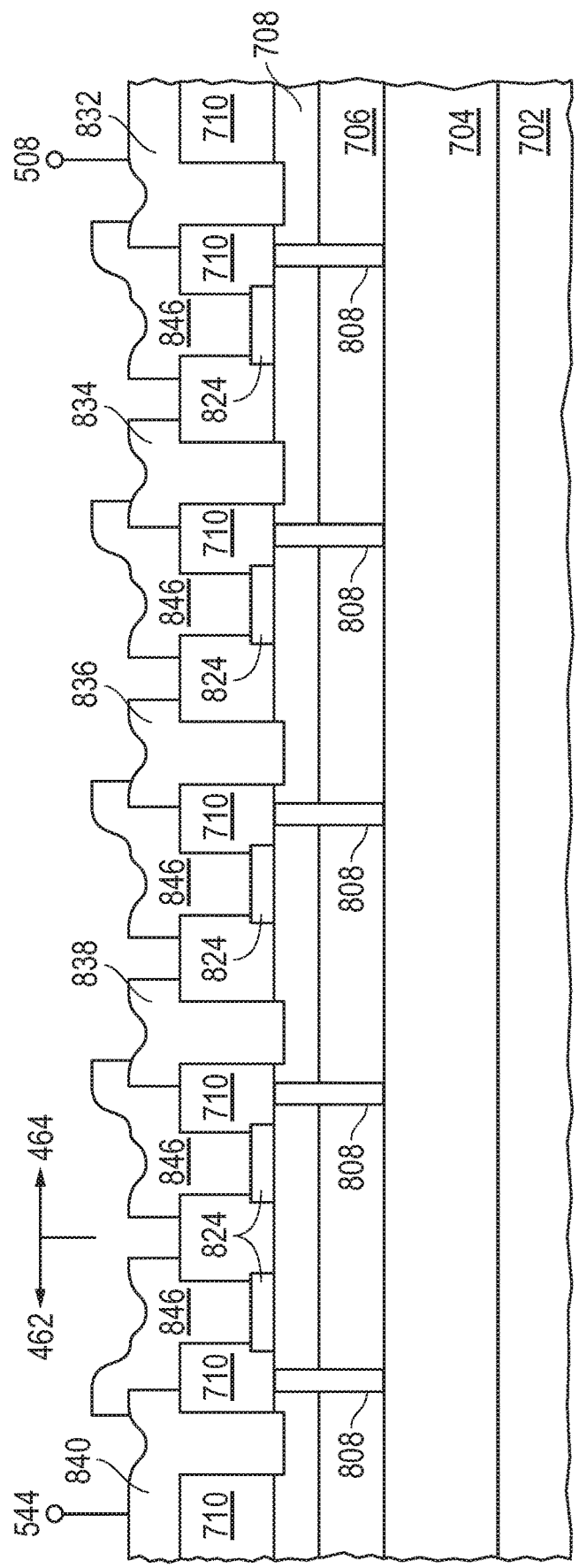
FIG. 8 includes an illustration of a cross-section view of portions of the diodes in FIG. 6.

FIG. 8 includes a cross-sectional view of the semiconductor die 414 that provides details of a non-limiting, exemplary embodiment for the diodes 462 and 464 in the box 640 (FIG. 6). The diodes 462 and 464 can be implemented as transistor structures where the gate and source electrodes of enhancement-mode transistors are shorted to each other. Each of the transistor structures can be designed to have a breakdown voltage of approximately 5 V. In another embodiment, a different breakdown voltage may be selected.

The diodes 462 and 464 can be implemented in a process flow used to form the low-side HEMT 124. Isolation regions 808 are formed that make the 2DEG discontinuous between the gate electrodes 824 and their corresponding source electrodes within each of the HEMT structures. The isolation regions 808 can be formed by implanting a p-type dopant. The isolation regions 808 extend through the interface between the channel and barrier layers 106 and 108 to break up the 2DEG. The isolation regions 808 may or may not extend completely through the channel layer 106. The dopant concentration within the isolation regions 808 is higher than an n-type dopant concentration of the channel layer 106, the barrier layer 108, or both. In an embodiment, the dopant concentration within the isolation regions 808 is no higher than the highest dopant concentration with respect to the gate electrodes 624. In an alternative embodiment, the isolation regions 808 can be defined by trenches that are filled with an insulating material. Gate electrodes 824 can be formed using the same process sequence as the gate electrodes 624 for the low-side HEMT 124.

Electrode 832 is a source electrode for its transistor structure and is coupled to the conductive member 508 (FIG. 5), electrodes 834, 836, and 838 are drains for the transistor structures to the right-hand side of each electrode and sources for the transistor structures to the left-hand side of each electrode. Thus, the diode 464 includes four serially connected transistor structures. Electrode 840 is a source electrode for its transistor structure and is coupled to the bond pad 544. The electrodes 832, 834, 836, 838, and 840 can be formed using the same process sequence as the source electrodes 626 for the low-side HEMT 124. Interconnects 846 electrically connect the gate electrodes 824 to their corresponding electrodes 832, 834, 836, 838, and 840. In an embodiment, the interconnects 846 can be formed using the same process sequence as the interconnect 646.

In another embodiment, the diodes 462 and 464 may be implemented as Schottky diodes. In still another embodiment, either or both of the diodes 462 and 464 may be formed using semiconductor pn junctions. The diode 462 may be implemented as a Zener diode. The diode 464 may be implemented as a set of serially connected Zener diodes or as a single pair of or alternating p-type and n-type semiconductor layers. The particular selection of physical structures for the diodes 462 and 464 can be made based on the needs or desires for a particular application. In the embodiment illustrated in the figures, the construction and spacings between the drain and gate electrodes 622 and 624 of the HEMT 124 can be substantially the same as the interconnect 642 and capacitor electrode 644 for the diodes 462 and 464.

Figure 9:
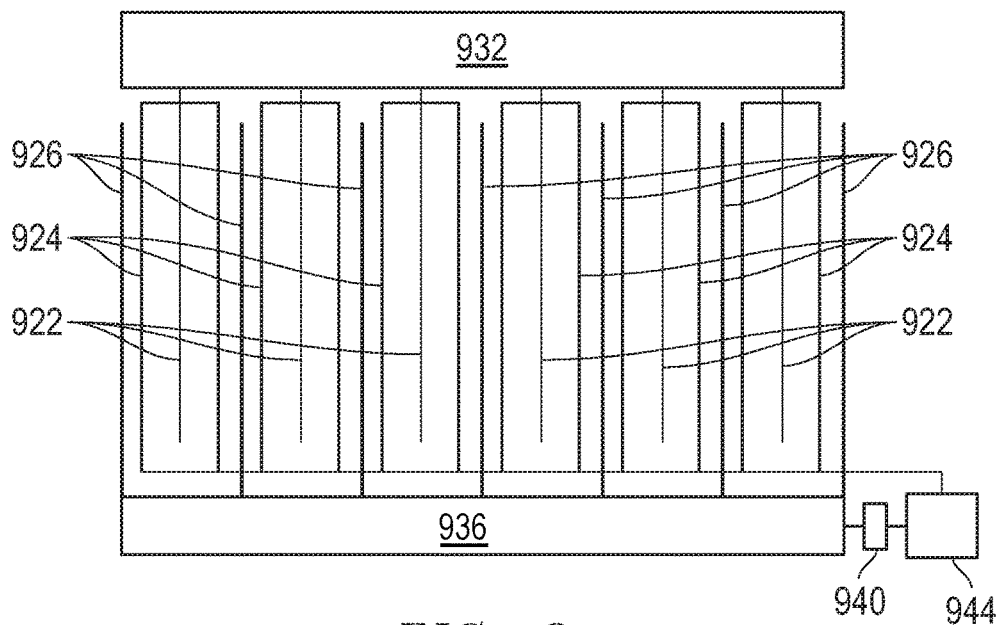
FIG. 9 includes an illustration of a top view of a layout for a die that includes a high-side transistor and diodes in accordance with another embodiment.

In another embodiment, one or both of the diodes 462 and 464 may be on same semiconductor die as the high-side HEMT 122. FIG. 9 includes an exemplary layout that includes drain electrodes 922 coupled to a drain bond pad 932, gate electrodes 924 coupled to a gate bond pad 944 (which is coupled to the source bond pad of the low-side HEMT 124), and source electrodes 926 coupled to a source bond pad 936. Box 940 includes the diodes 462 and 464 and is coupled to the source bond pad 936 and the gate bond pad 944. The diodes 462 and 464 can have any of the structures as previously described with respect to the embodiments associated with FIG. 8. The co-location of the diodes 464 and 462 with the high-side HEMT 122 may be beneficial as the diodes 462 and 464 are closer to the gate and source electrodes 924 and 926 of the high-side HEMT 122.

In another embodiment, one or both of the diodes 462 and 464 may be on same semiconductor die as the high-side HEMT 122. FIG. 9 includes an exemplary layout that includes drain electrodes 922 coupled to a drain bond pad 932, gate electrodes coupled to a gate bond pad 944 (which is coupled to the source bond pad of the low-side HEMT 124), and source electrodes 926 coupled to a source bond pad 936. Box 960 includes the diodes 462 and 464 and is coupled to the source bond pad 936 and the gate bond pad 944. The diodes 462 and 464 can have any of the structures as previously described with respect to the embodiments associated with FIG. 8. The co-location of the diodes 464 and 462 with the high-side HEMT 122 may be beneficial as the diodes 462 and 464 are closer to the gate and source electrodes 924 and 926 of the high-side HEMT 122.

The previously described embodiments are useful when the circuit 400 operates at a voltage higher than each of the HEMTs 122 and 124. In a particular example, the circuit 100 or 400 ($V_{DS\ CIRCUIT}$) may be designed to operate at 800 V, and each of the HEMTs 122 and 124 can withstand a $V_{DS\ HEMT}$ of 650 V. In another embodiment, a circuit $V_{DS\ CIRCUIT}$ may need to normally operate at a 1200 V. While in theory, no further HEMTs should be needed, in practice, the node 108 may reach voltages in a transient state shortly after a switching operation where $V_{DS\ HEMT}$ of the HEMT 122 or 124 may exceed 650 V and adversely affect such HEMT.

Figure 10:
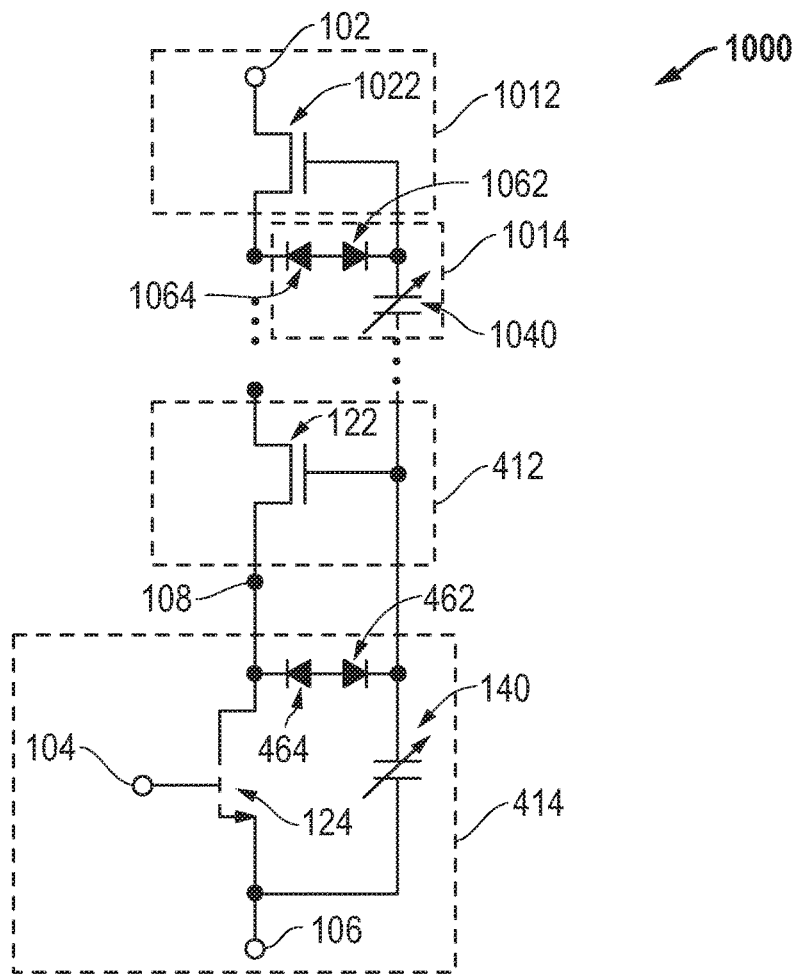
FIG. 10 includes a depiction of a schematic diagram of a circuit in accordance with a further embodiment.

FIG. 10 includes an embodiment in which one or more stages can be added to a circuit 1000 to allow the circuit to operate at a higher voltage. Each stage can include a HEMT, a variable capacitor, and a pair of diodes. In FIG. 10, a HEMT 1022 can have a drain coupled to the drain terminal 102, and a source coupled to a cathode of a diode 1064 and a drain of a next lower HEMT (with respect to voltages within the circuit 1000), such as the drain of the high-side HEMT 122. A gate of the HEMT 1022 can be coupled to a cathode of a diode 1062 and an electrode of a variable capacitor 1040. Anodes of the diodes 1062 and 1064 are coupled to each other. The other electrode of the variable capacitor 1040 is coupled to a gate of a next lower HEMT (with respect to voltages within the circuit 1000), such as the gate of the high-side HEMT 122.

In an embodiment, the HEMT 1022 can be on a semiconductor die 1012, and the variable capacitor 1040 and the diodes 1062 and 1064 can be on a semiconductor die 1014. Such a configuration can allow for a module implementation to achieve a desired operating voltage for the circuit 1000. In this manner, all HEMTs except for the low-side HEMT 124 can have identical constructions, and each die that includes a variable capacitor, like variable capacitor 1040, and diodes, like diodes 1062 and 1064, can have identical constructions. If the operating voltage of the circuit is 1600 V, another die identical to die 1012 and another die identical to die 1014 can be implemented. In a particular embodiment, the die 1014 can be implemented using an AlGaN or another semiconductor technology. For example, the components of the die 1014 can be implemented in a Si, SiC, or other compound semiconductor technology.

Embodiments can be implemented without complications that can occur with scaling a HEMT to operate at a higher voltage. For example, a HEMT operating at such a higher voltage may need a significantly thicker or more complicated buffer layer. The thicker buffer layer can result in more mechanical stress and result in wafer warpage. The modular design allows for easier scaling to higher operating voltage for the circuit. By limiting the operating voltage for each to HEMTs to voltages commonly used, a high voltage circuit can be designed without having to devise a new complicated or marginal process technology or physical design.

In some embodiments, the variable capacitor and diodes can be implemented within an AlGaN technology and without adding any new steps. The changes can be implemented by modifying existing masks used to form a HEMT, wherein such modifications incorporate the variable capacitor and diodes. Further, the variable capacitor can operate within the voltage that its die will normally experience and not take up too much area. Thus, any individual or combination of the variable capacitor and diodes may occupy no more than 20% of the area of the die on which it resides. In another embodiment, the variable capacitor and diodes can be on a separate die to allow for a module construction that is well suited to be used over a range of voltages for the circuit.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1

A circuit can include a first high electron mobility transistor; a second high electron mobility transistor, wherein a drain of the first high electron mobility transistor is coupled to a source of the second high electron mobility transistor; and a first variable capacitor, wherein a first electrode of the first variable capacitor is coupled to a source of the first high electron mobility transistor, and a second electrode of the first variable capacitor is coupled to a gate of the second high electron mobility transistor.

Embodiment 2

The circuit of Embodiment 1, wherein the first high electron mobility transistor is an enhancement-mode transistor, and the second high electron mobility transistor is a depletion-mode transistor.

Embodiment 3

The circuit of Embodiment 1, further includes a first diode and a second diode, wherein a cathode of the first diode is coupled to the second electrode of the first variable capacitor, an anode of the first diode is coupled to an anode of the second diode, and a cathode of the second diode is coupled to the drain of the first high electron mobility transistor and the source of the second high electron mobility transistor.

Embodiment 4

The circuit of Embodiment 1, further includes a source terminal coupled to the source of the first high electron mobility transistor; a control terminal coupled to a gate of the first high electron mobility transistor; and a drain terminal coupled to a drain of the second high electron mobility transistor.

Embodiment 5

The circuit of Embodiment 1, wherein the drain of the first high electron mobility transistor and a source of the second high electron mobility transistor are electrically connected to each other at an intermediate node, and the first variable capacitor has a capacitance, such that, when the circuit is in an off-state, the intermediate node has a voltage that is within 10% of half of a voltage difference between the source of the first high electron mobility transistor and a drain of the second high electron mobility transistor.

Embodiment 6

The circuit of Embodiment 1, further includes a third high electron mobility transistor; and a second variable capacitor, wherein a first electrode of the second variable capacitor is coupled to the gate of the second high electron mobility transistor, a second electrode of the second variable capacitor is coupled to a gate of the third high electron mobility transistor, and the drain of the second high electron mobility transistor is coupled to a source of the third high electron mobility transistor.

Embodiment 7

The circuit of Embodiment 6, wherein the first high electron mobility transistor is an enhancement-mode transistor, and each of the second and third high electron mobility transistors is a depletion mode transistor.

Embodiment 8

The circuit of Embodiment 1, further includes a first diode and a second diode, wherein the first high electron mobility transistor is an enhancement-mode transistor, the second high electron mobility transistor is a depletion-mode transistor, a cathode of the first diode is electrically connected to the second electrode of the first variable capacitor, an anode of the first diode is electrically connected to an anode of the second diode, and a cathode of the second diode is electrically connected to the drain of the first high electron mobility transistor and the source of the second high electron mobility transistor.

Embodiment 9

An electronic device can include a first die including a first high electron mobility transistor; and a first variable capacitor, wherein a first electrode of the first variable capacitor is coupled to a source or a gate of the first high electron mobility transistor, and a second electrode of the first variable capacitor is coupled to a first external terminal of the first die.

Embodiment 10

The electronic device of Embodiment 9, further includes a second die including a second high electron mobility transistor, wherein a gate electrode of the second high electron mobility transistor is coupled to a first external terminal of the second die that is coupled to the first external terminal of the first die, a drain electrode of the first high electron mobility transistor is coupled to a second external terminal of the first die, and a source electrode of the second high electron mobility transistor is coupled to a second external terminal of the second die that is coupled to the second external terminal of the first die.

Embodiment 11

The electronic device of Embodiment 10, wherein the first electrode of the first variable capacitor is coupled to the source electrode of the first high electron mobility transistor, and the second electrode is coupled to the gate electrode of the second high electron mobility transistor.

Embodiment 12

The electronic device of Embodiment 10, wherein the first high electron mobility transistor is an enhancement-mode transistor, and the second high electron mobility transistor is a depletion-mode transistor.

Embodiment 13

The electronic device 10, further includes a third high electron mobility transistor and a second variable capacitor, wherein a drain of the second high electron mobility transistor is coupled to a source of the third high electron mobility transistor, a first electrode of the second variable capacitor is coupled to the gate of the second high electron mobility transistor, and a second electrode of the second variable capacitor is coupled to a gate of the third high electron mobility transistor.

Embodiment 14

The electronic device of Embodiment 13, further includes a first diode and a second diode, wherein a cathode of the first diode is electrically connected to the second electrode of the second variable capacitor, an anode of the first diode is electrically connected to an anode of the second diode, a cathode of the second diode is electrically connected to the drain of the second high electron mobility transistor and the source of the third high electron mobility transistor, the third high electron mobility transistor is on a third die, and the second variable capacitor and the first and second diodes are on a fourth die.

Embodiment 15

The electronic device of Embodiment 9, wherein the first die further includes a first diode and a second diode, wherein a cathode of the first diode is coupled to the second electrode of the first variable capacitor, an anode of the first diode is coupled to an anode of the second diode, and a cathode of the second diode is coupled to a drain electrode of the first high electron mobility transistor.

Embodiment 16

The electronic device of Embodiment 9, wherein the drain electrode of the first high electron mobility transistor and an interconnect of the first variable capacitor have substantially a same composition, the gate electrode of the first high electron mobility transistor and a capacitor electrode of the first variable capacitor have substantially a same composition, and a spacing between the drain electrode and the gate electrode of the first high electron mobility transistor is substantially the same as a spacing between the interconnect of the first variable capacitor and the capacitor electrode of the first variable capacitor.

Embodiment 17

The electronic device of Embodiment 9, further includes a first diode, a second diode, and a second high electron mobility transistor, wherein the first high electron mobility transistor is an enhancement-mode transistor, the second high electron mobility transistor is a depletion-mode transistor, the first electrode of the variable capacitor is electrically connected to the source of the first high electron mobility transistor, the second electrode of the variable capacitor is electrically connected to the gate of the second high electron mobility transistor and to a cathode of the first diode, a drain electrode of the first high electron mobility transistor is electrically connected to a source electrode of the second high electron mobility transistor and to a cathode of the second diode, an anode of the first diode is electrically connected to an anode of the second diode, the first high electron mobility transistor, the variable capacitor, and the first and second diodes are on a first die, and the second high electron mobility transistor is on a second die.

Embodiment 18

An electronic device can include a first die, wherein the first die includes a variable capacitor; a first diode; and a second diode, wherein a first electrode of the variable capacitor is coupled to a first external terminal of the first die, a second electrode of the variable capacitor and a cathode of the first diode are coupled to a second external terminal of the first die, an anode of the first diode is coupled to an anode of the second diode, and a cathode of the second diode is coupled to a third external terminal of the first die.

Embodiment 19

The electronic device of Embodiment 18, further includes a first high electron mobility transistor, wherein a gate of the first high electron mobility transistor is coupled to the first or second electrode of the variable capacitor, and a drain or a source of the first high electron mobility transistor is coupled to the cathode of the second diode.

Embodiment 20

The electronic device of Embodiment 19, further includes a second high electron mobility transistor, wherein the gate of the first high electron mobility transistor is coupled to the first electrode of the variable capacitor, a gate of the second high electron mobility transistor is coupled to the second electrode of the variable capacitor, the drain of the first high electron mobility transistor and a source of the second high electron mobility transistor are coupled to the cathode of the second diode, and the first high electron mobility transistor, the second high electron mobility transistor, or both transistors are on at least one die different from the first die.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:
1. A circuit comprising:
a first high electron mobility transistor;
a second high electron mobility transistor, wherein a drain of the first high electron mobility transistor is coupled to a source of the second high electron mobility transistor; and
a first variable capacitor, wherein a first electrode of the first variable capacitor is coupled to a source of the first high electron mobility transistor, and a second electrode of the first variable capacitor is coupled to a gate of the second high electron mobility transistor;
a first diode including a first electrode and a second electrode: and
a second diode including a first electrode and a second electrode, wherein:
the first electrode of the first diode is coupled to the second electrode of the first variable capacitor,
the second electrode of the first diode is electrically connected to the second electrode of the second diode,
the first electrode of the second diode is coupled to the drain of the first high electron mobility transistor and the source of the second high electron mobility transistor,
the first electrodes of the first diode and the second diode are both cathodes, and the second electrodes of the first diode and the second diode are both anodes.

2. The circuit of claim 1, wherein the drain of the first high electron mobility transistor and the source of the second high electron mobility transistor are electrically connected to each other at an intermediate node, and the first variable capacitor has a capacitance, such that, when the circuit is in an off-state, the intermediate node has a voltage that is within 10% of half of a voltage difference between a source of the first high electron mobility transistor and a drain of the second high electron mobility transistor.

3. The circuit of claim 1, further comprising: a third high electron mobility transistor; and a second variable capacitor, wherein: a first electrode of the second variable capacitor is coupled to the gate of the second high electron mobility transistor, a second electrode of the second variable capacitor is coupled to a gate of the third high electron mobility transistor, and a drain of the second high electron mobility transistor is coupled to a source of the third high electron mobility transistor, and the first variable capacitor lies along a conduction path between the second variable capacitor and a source of the first high electron mobility transistor.

4. An electronic device comprising a first die including:
a channel layer;
a barrier layer contacting the channel layer;
a first high electron mobility transistor that includes the barrier layer and the channel layer; and
a first variable capacitor,
wherein:
a first electrode of the first variable capacitor overlies a heterojunction between the barrier layer and the channel layer, wherein the first electrode of the first variable capacitor is coupled to a source or a gate of the first high electron mobility transistor, and
a second electrode of the first variable capacitor is coupled to a first external terminal of the first die.

5. The electronic device of claim 4, further comprising a second die including a second high electron mobility transistor, wherein:
a gate electrode of the second high electron mobility transistor is coupled to a first external terminal of the second die that is coupled to the first external terminal of the first die,
a drain electrode of the first high electron mobility transistor is coupled to a second external terminal of the first die, and
a source electrode of the second high electron mobility transistor is coupled to a second external terminal of the second die that is coupled to the second external terminal of the first die.

6. The electronic device of claim 5, wherein the first electrode of the first variable capacitor is coupled to the source electrode of the first high electron mobility transistor, and the second electrode is coupled to the gate electrode of the second high electron mobility transistor.

7. The electronic device of claim 5, wherein the first high electron mobility transistor is an enhancement-mode transistor, and the second high electron mobility transistor is a depletion-mode transistor.

8. The electronic device 10, further comprising a third high electron mobility transistor and a second variable capacitor, wherein:
a drain of the second high electron mobility transistor is coupled to a source of the third high electron mobility transistor, a first electrode of the second variable capacitor is coupled to the gate of the second high electron mobility transistor, and
a second electrode of the second variable capacitor is coupled to a gate of the third high electron mobility transistor.

9. The electronic device of claim 8, further comprising a first diode and a second diode, wherein:
a cathode of the first diode is electrically connected to the second electrode of the second variable capacitor,
an anode of the first diode is electrically connected to an anode of the second diode,
a cathode of the second diode is electrically connected to the drain of the second high electron mobility transistor and the source of the third high electron mobility transistor,
the third high electron mobility transistor is on a third die, and
the second variable capacitor and the first and second diodes are on a fourth die.

10. The electronic device of claim 4, further comprising first diode and a second diode, wherein:
a cathode of the first diode is coupled to the second electrode of the first variable capacitor,
an anode of the first diode is electrically connected to an anode of the second diode, and
a cathode of the second diode is coupled to a drain electrode of the first high electron mobility transistor.

11. The electronic device of claim 4, wherein:
the drain electrode of the first high electron mobility transistor and an interconnect of the first variable capacitor have substantially a same composition,
the gate electrode of the first high electron mobility transistor and a capacitor electrode of the first variable capacitor have substantially a same composition, and
a spacing between the drain electrode and the gate electrode of the first high electron mobility transistor is substantially the same as a spacing between the interconnect of the first variable capacitor and the capacitor electrode of the first variable capacitor.

12. The electronic device of claim 4, further comprising a first diode, a second diode, and a second high electron mobility transistor, wherein:
the first high electron mobility transistor is an enhancement-mode transistor,
the second high electron mobility transistor is a depletion-mode transistor,
the first electrode of the variable capacitor is electrically connected to the source of the first high electron mobility transistor,
the second electrode of the variable capacitor is electrically connected to the gate of the second high electron mobility transistor and to a cathode of the first diode,
a drain electrode of the first high electron mobility transistor is electrically connected to a source electrode of the second high electron mobility transistor and to a cathode of the second diode,
an anode of the first diode is electrically connected to an anode of the second diode,
the first high electron mobility transistor, the variable capacitor, and the first and second diodes are on a first die, and
the second high electron mobility transistor is on a second die.

13. An electronic device comprising a first die, wherein the first die comprises:
- a first external terminal, a second external terminal, and a third external terminal;
- a variable capacitor including a first electrode and a second electrode;
- a first diode including an anode and a cathode; and
- a second diode including an anode and a cathode, wherein:
- the first electrode of the variable capacitor is coupled to the first external terminal of the first die,
- the second electrode of the variable capacitor is coupled to the second external terminal of the first die,
- the second electrode of the variable capacitor is electrically connected to the cathode of the first diode,
- the anode of the first diode is electrically connected to an anode of the second diode, and
- the cathode of the second diode is coupled to the third external terminal of the first die.

14. The electronic device of claim 13, further comprising a first high electron mobility transistor, wherein:
- a gate of the first high electron mobility transistor is coupled to the first or second electrode of the variable capacitor, and
- a drain or a source of the first high electron mobility transistor is coupled to the cathode of the second diode.

15. The electronic device of claim 14, further comprising a second high electron mobility transistor, wherein:
- the gate of the first high electron mobility transistor is coupled to the first electrode of the variable capacitor,
- a gate of the second high electron mobility transistor is coupled to the second electrode of the variable capacitor,
- the drain of the first high electron mobility transistor and a source of the second high electron mobility transistor are coupled to the cathode of the second diode, and
- the first high electron mobility transistor, the second high electron mobility transistor, or both transistors are on at least one die different from the first die.

16. The electronic device of claim 4, wherein the variable capacitor is configured such that a capacitance of the variable capacitor significantly decreases at a voltage in a range from 300 V to 320 V.

17. The electronic device of claim 4, further comprising a first diode and a second diode, wherein the second diode has a different number of diode structures as compared to the first diode.

18. The electronic device of claim 4, wherein the first electrode of the first variable capacitor contacts the barrier layer.

19. The electronic device of claim 4, wherein the first electrode of the first variable capacitor is spaced apart from the barrier layer by a capacitor dielectric layer of the first variable capacitor.

* * * * *